United States Patent [19]

Meyer et al.

[11] Patent Number: 5,459,765
[45] Date of Patent: Oct. 17, 1995

[54] PHASE COMPARATOR FOR BIPHASE CODED SIGNAL INCLUDING PREAMBLE WITH CODE VIOLATION

[75] Inventors: Charles S. Meyer, Nevada City; Donald S. Lydon, Colfax, both of Calif.

[73] Assignee: Nvision, Inc., Grass Valley, Calif.

[21] Appl. No.: 3,534

[22] Filed: Jan. 12, 1993

[51] Int. Cl.[6] .............................. H04L 7/02; H04L 7/00
[52] U.S. Cl. ........................ 375/360; 375/375; 327/23; 327/12
[58] Field of Search ...................... 375/110, 118, 375/120, 20, 55, 87, 359, 375, 376, 373, 293, 294; 307/510, 511, 514; 328/55, 63, 109, 134, 155; 327/2, 3, 159, 156, 141, 163, 23, 98; 370/105.4

[56] References Cited

U.S. PATENT DOCUMENTS

| | | | |
|---|---|---|---|
| 4,218,657 | 8/1980 | Rast | 455/183.1 |
| 4,371,974 | 2/1983 | Dugan | 375/82 |
| 4,380,815 | 4/1983 | Clendening | 375/120 |
| 4,402,084 | 8/1983 | Jungmeister | 375/110 |
| 4,829,545 | 5/1989 | Guzik et al. | 375/120 |
| 4,964,117 | 10/1990 | Shier | 375/108 |
| 4,984,255 | 1/1991 | Davis et al. | 375/110 |
| 5,040,193 | 8/1991 | Leonowich et al. | 375/87 |
| 5,123,030 | 6/1992 | Kazawa et al. | 375/110 |
| 5,164,966 | 11/1992 | Hershberger | 375/110 |
| 5,172,397 | 12/1992 | Llewellyn | 375/110 |
| 5,249,186 | 9/1993 | Remsen | 375/110 |
| 5,329,556 | 7/1994 | Meitner et al. | 375/118 |

Primary Examiner—Stephen Chin
Assistant Examiner—Tesfaldet Bocure
Attorney, Agent, or Firm—Smith-Hill and Bedell

[57] ABSTRACT

Phase of first and second signals is compared by producing an output signal in the event of a predetermined phase relationship between the first and second signals and clearing the output signal at a predetermined phase during the cycle of the second signal regardless of the state of the first signal.

19 Claims, 4 Drawing Sheets

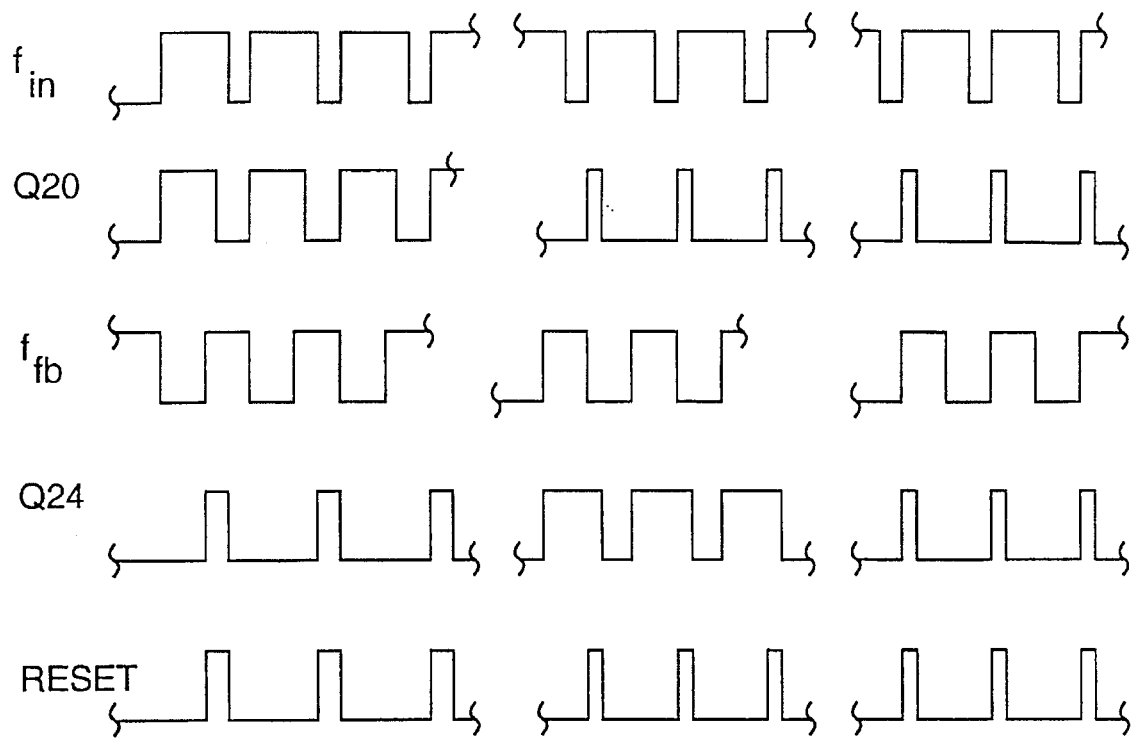
FIG. 2A
(PRIOR ART)
FIG. 2B
(PRIOR ART)
FIG. 2C
(PRIOR ART)
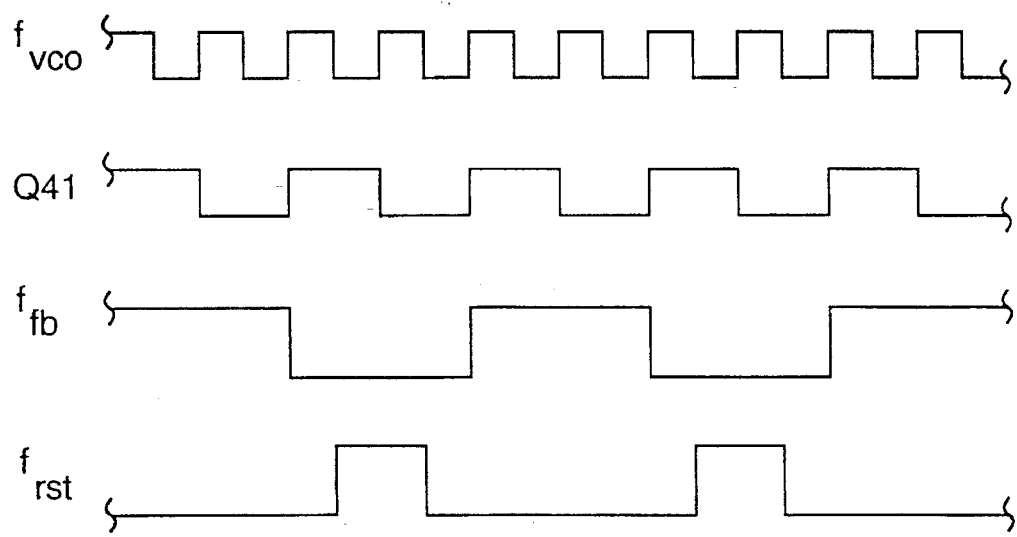
FIG. 4

PHASE COMPARATOR FOR BIPHASE CODED SIGNAL INCLUDING PREAMBLE WITH CODE VIOLATION

BACKGROUND OF THE INVENTION

This invention relates to a phase comparator for a biphase coded signal including a preamble with code violation.

One form of data coding is known as biphase coding. In biphase coding, a signal epoch is divided into time slots by a clock, and one source data bit occupies a single time slot. Each source data bit may be represented by a two-cell doublet. Each coding doublet begins, and therefore also ends, with a transition. A source data bit one generates a transition between the two cells of the doublet, whereas a source data bit zero does not. Thus, a source data bit zero is represented either as the doublet zero zero or the doublet one one, while a source data bit one is represented either by the doublet one zero or the doublet zero one.

In order to recover data from a biphase coded signal, it is necessary first to extract clock information from the signal. The biphase signal (FIG. 1, waveform A) is first differentiated and rectified, by applying the biphase signal and a delayed version thereof to respective inputs of an exclusive OR gate 2, so as to produce a signal (waveform B) that has one pulse for each transition of the biphase coded signal. The resulting pulse train is applied to a non-retriggerable one-shot 4 having a shot duration equal to approximately 75% of the clock period. On the pulse representing the second transition of the first source data bit zero (and the first transition of the next source data bit), the one-shot is set and its output remains high for 75% of the next clock period. If the next source data bit is also zero, the one-shot is set by the pulse representing the transition at the end of that bit, and if the next source data bit is one, the one-shot filters out the pulse that occurs between the two cells of the doublet and is set again by the pulse representing the transition at the end of that source data bit. The output of the one-shot is therefore a pulse train at the data clock frequency and having a 75% duty cycle (FIG. 1, waveform C).

As also shown in FIG. 1, the output of the one-shot may be applied to one input of a phase comparator 6 that is connected in a phase lock loop that also includes a voltage-controlled oscillator (VCO) 8, a frequency divider 10 and an inverting integrating error amplifier 12, connected as shown. The frequency range of the output signal of the VCO includes four times the clock frequency and the frequency divider 10 divides the frequency of the output signal of the VCO 8 by a factor of four.

The phase comparator examines the phase difference between the input signal and the feedback signal provided by the VCO 8 and provides an error signal representative of the phase difference. The error signal acts through the error amplifier to keep the feedback signal synchronized to the input signal.

The phase comparator comprises two D flip-flops 20 and 24, each receiving a logical one at its D input. The flip-flop 20 receives the input signal fin (the output of one-shot 4) at its clock input, and the flip-flop 24 receives the feedback signal $f_{fb}$ provided by the VCO 8 and the frequency divider 10. The Q output of the flip-flop 20 is connected through an inverter 22 to the cathode of a diode 26, whose anode is connected to the error amplifier through a resistor 38, and the Q output of the flip-flop 24 is connected to the anode of a diode 28, whose cathode is connected to the error amplifier through a resistor 40. The Q outputs of the two flip-flops are connected as respective inputs to an AND gate 30, whose output is connected to the reset inputs of the flip-flops.

Operation of the phase comparator shown in FIG. 1 can be understood by considering the condition in which the feedback signal is at about the same frequency as the input signal but is not synchronized with the input signal. In this condition, a single clocking transition of the feedback signal will occur between each two successive clocking transitions of the input signal. If it is assumed that the two flip-flops are in the reset condition (both Q20 and Q24 are low) and that the next clocking transition that is received by the phase comparator is a transition of the input signal fin (FIG. 2A), flip-flop 20 is set high before flip-flop 24. During the time interval between the input signal transition and the subsequent feedback signal transition, the output of flip-flop 20 remains in the set condition while the output of flip-flop 24 remains in the reset condition. Consequently, inverter 22 pulls charge through diode 26 from the error amplifier during this time interval. Since the error amplifier is an inverting amplifier, the control voltage applied to the VCO 8 increases, so that the transitions of the feedback signal are advanced in time relative to what would happen if the control voltage remained constant. In this condition, the input signal $f_{in}$ is said to lead the feedback signal. When the clocking transition of the feedback signal is received by flip-flop 24, AND gate 30 resets both flip-flops and inverter 22 stops pulling charge from the error amplifier. Conversely, if the next clocking transition received by the comparator when both flip-flops are in the reset condition is a transition of the feedback signal (FIG. 2B), then flip-flop 24 pumps charge through diode 28 into the error amplifier during the time interval between the feedback signal's clocking transition and the subsequent transition of the input signal. The control voltage applied to the VCO decreases, so that the transitions of the feedback signal are retarded in time. The input signal is said to lag the feedback signal. In this fashion, the phase comparator operates to adjust the VCO to synchronize the output signal of the frequency divider with the input signal (FIG. 2C) and the phase lock loop produces a regenerated clock that is coherently related to the clock information in the biphase coded signal and can be applied to a data recovery flip-flop 14 to recover data from the biphase coded signal.

The conventional phase comparator shown in FIG. 2 has a capture range of almost +/−2 π relative to the cycle of the feedback signal, i.e. the input signal can lead or lag the feedback signal by up to 2 π and the phase comparator will still function in the manner described above. If the input signal is leading (or lagging) the feedback signal by an angle approaching 2 π, and the angle increases to 2 π+Δ, the phase lock loop's behavior changes to treat the input signal as lagging (leading) the feedback signal by 2 π−Δ.

The Audio Engineering Society/European Broadcasting Union datastream for digital audio data consists of a biphase coded signal in which each audio sample is represented by a subframe containing 32 time slots. The Audio Engineering Society and European Broadcasting Union standards do not prescribe the clock frequency of the biphase coded signal used for the digital audio datastream. In different applications, clock frequencies ranging from 1.792 MHz to 3.456 MHz are employed.

In accordance with the Audio Engineering Society/European Broadcasting Union standards, the first four time slots of each subframe constitute a preamble containing at least one occurrence of the three cell sequence zero zero zero or one one one. This brief departure from the usual biphase coding rules is known as a code violation. If the circuit shown in FIG. 1 is used to extract clock information from an AES/EBU signal, the code violation results in a momentary change in the frequency of the clock signal provided by the one-shot 4, and in pumping of excess charge into, or pulling of excess charge from, the error amplifier 4. So long as the time constant of the error amplifier exceeds the duration of the preamble, the code violation does not cause the phase lock loop to lose lock. Nevertheless, the code violation causes an increase in jitter, and this can affect the accuracy with which data is extracted.

A duty-cycle sensitive phase comparator may be used in the circuit shown in FIG. 1 instead of the edge sensitive phase comparator 6 to provide improved immunity to the code violation, but this measure is subject to the disadvantage that the capture range of a duty-cycle sensitive phase comparator is only $+/-\pi$ relative to the period of the feedback signal, so that if the input signal leads or lags the feedback signal by an angle greater than $\pi$ radians, the phase lock loop cannot acquire lock.

The VCO 8 might be implemented using a crystal controlled oscillator, in which case the gain of the VCO (in radians per volt) is sufficiently small that the change in the control voltage due to the code violation would not normally disturb operation of the phase lock loop to such an extent as to prevent accurate recovery of data. However, a phase lock loop with a crystal controlled oscillator cannot operate over the frequency range from 1.792 MHz to 3.456 MHz.

A VCO that is implemented using an LC oscillator can operate over a much wider range of frequencies than a crystal controlled oscillator, but the gain of such a VCO is substantially higher than that of a crystal controlled oscillator so that although the code violation might not cause the phase lock loop to lose lock with the input signal, the amount of jitter introduced by the violation could interfere with accurate data recovery.

SUMMARY OF THE INVENTION

In accordance with a first aspect of the present invention there is provided a method of comparing phase of first and second signals, said method comprising producing an output signal in the event of a predetermined phase relationship between the first and second signals, and clearing the output signal at a predetermined phase during the cycle of the second signal regardless of the state of the first signal.

In accordance with a second aspect of the invention there is provided a method of comparing phase of first and second signals, wherein the first signal is composed of periodic frames each comprising a preamble and a data interval, said method comprising (a) producing an output signal according to the phase relationship between the first and second signals, and (b) disabling step (a) during the preamble of the first signal.

In accordance with a third aspect of the invention there is provided an apparatus for comparing phase of first and second signals, comprising means for producing an output signal in the event of a predetermined phase relationship between the first and second signals, and means for clearing the output signal at a predetermined phase during the cycle of the second signal regardless of the state of the first signal.

In accordance with a fourth aspect of the invention there is provided a phase comparison apparatus comprising a phase comparator means for receiving a first periodic signal having a first frequency, a second periodic signal having a second frequency closely matching said first frequency and a mask signal having an enable state and a disable state, and wherein said phase comparator means is operative to produce an output signal according to the phase relationship between the first periodic signal and the second periodic signal when the mask signal is in the enable state.

BRIEF DESCRIPTION OF THE DRAWINGS

For a better understanding of the invention, and to show how the same may be carried into effect, further reference will be made by way of example, to the accompanying drawings in which:

FIGS. 2A, 2B and 2C are timing diagrams illustrating operation of the circuit shown in FIG. 1;

FIG. 4 is a timing diagram illustrating certain aspects operation of the circuit shown in FIG. 3.

In the several figures of the drawings, like reference numerals designate like components.

DETAILED DESCRIPTION

Figure 1:
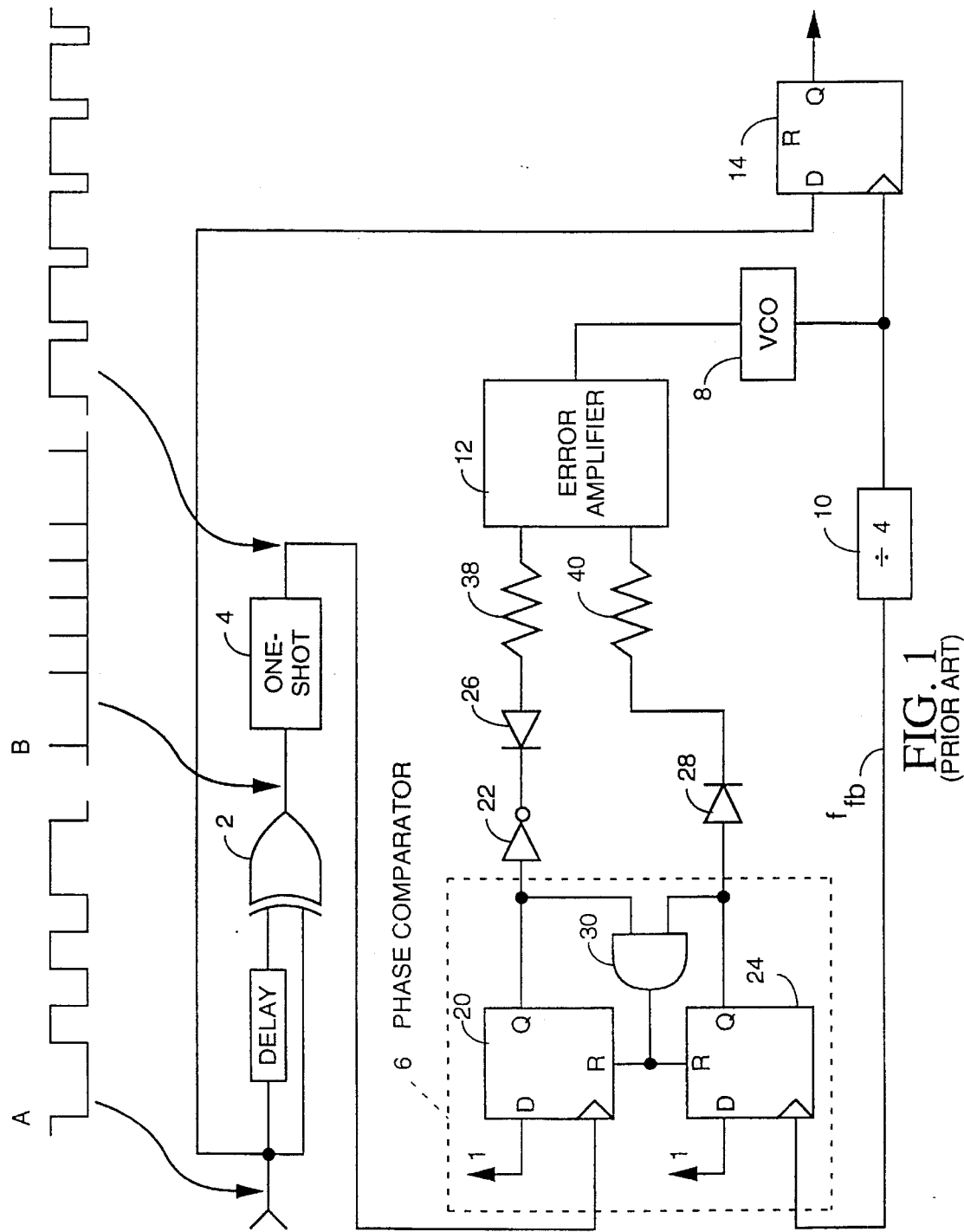
FIG. 1 is a diagram of a conventional circuit for extracting clock information from a biphase coded signal.
Figure 3:
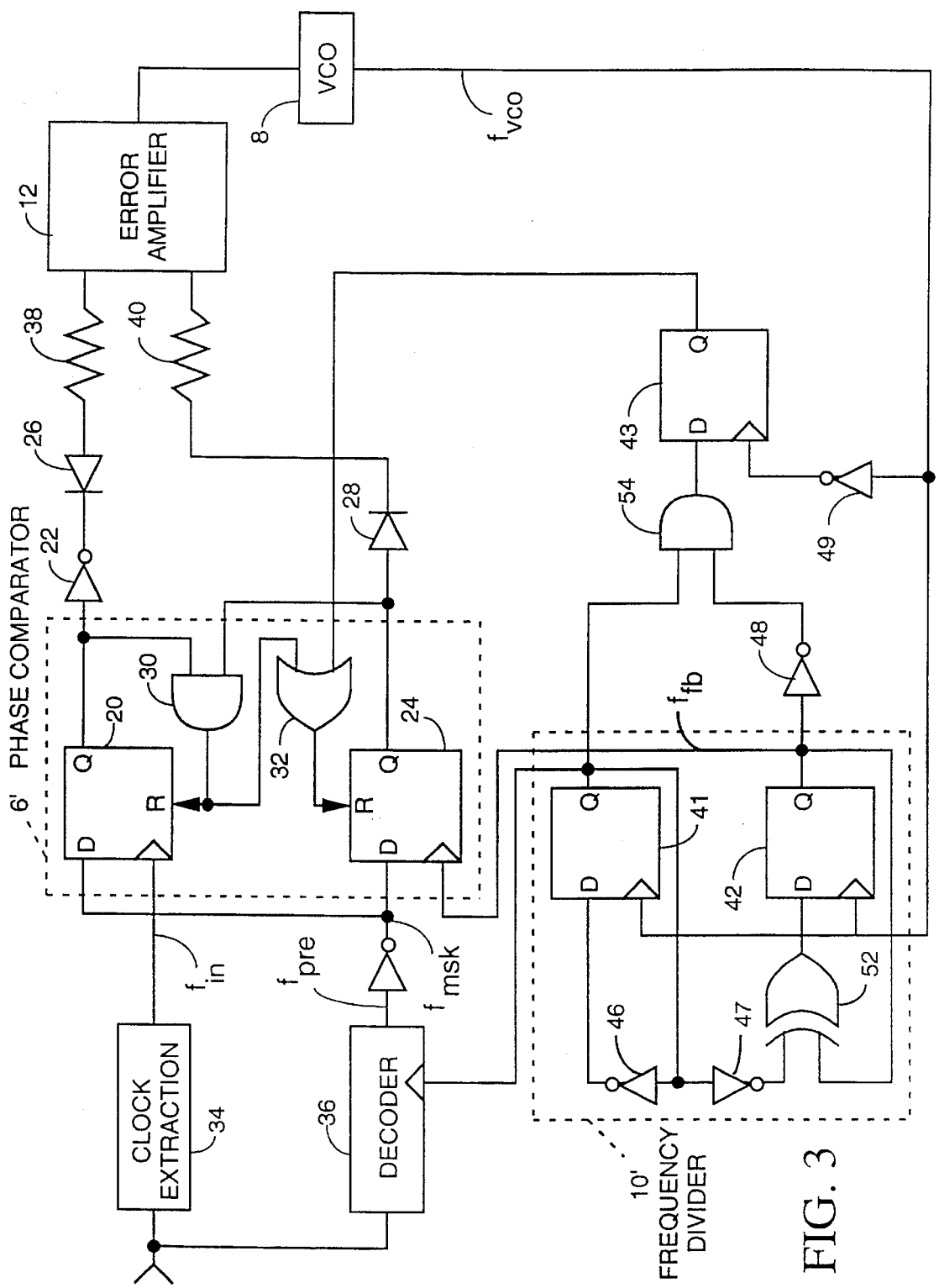
FIG. 3 is a diagram of circuit embodying the invention.
Figure 5:
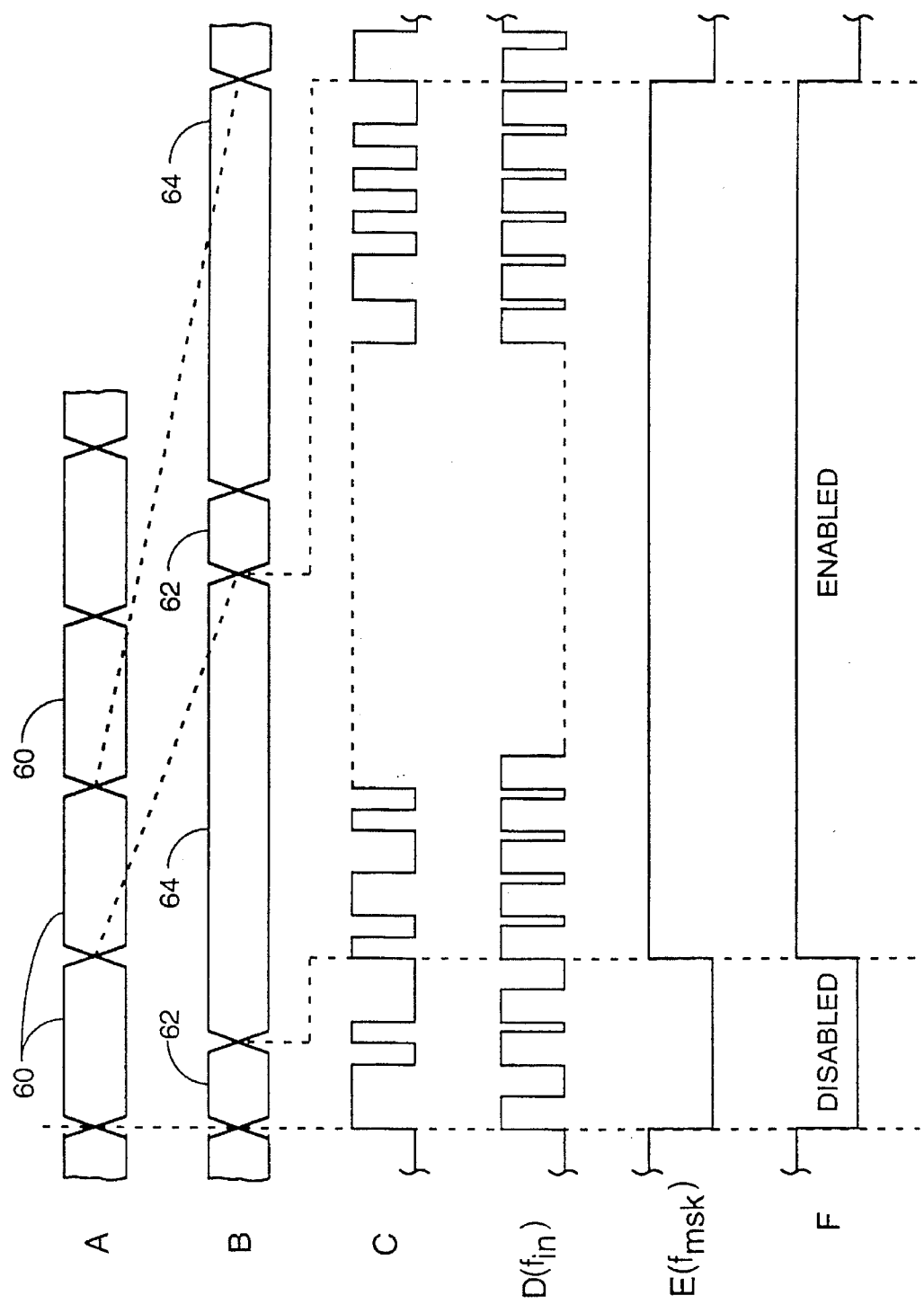
FIG. 5 is a timing diagram illustrating other aspects of operation of the circuit shown in FIG. 3.

The circuit illustrated in FIG. 3 comprises a clock extraction circuit 34, which may be as shown in FIG. 1. The clock extraction circuit 3 receives a biphase coded signal in accordance with the AES/EBU standard at its input. As shown in FIG. 5, the biphase coded signal is composed of periodic frames 60 (FIG. 5, waveform A) and each frame comprises a preamble 62 and a data interval 64 (FIG. 5, waveforms B and C). The clock extraction circuit 34 provides a 75% duty cycle extracted clock signal (FIG. 5 waveform D) at its output. The extracted clock signal is applied to one input of a phase comparator 6' that is connected in a phase lock loop with an error amplifier 12, a VCO 8 and a frequency divider 10'.

The frequency divider 10' comprises two flip-flops 41, 42 that receive the signal $f_{vco}$ provided by the VCO 8 at their clock inputs. The Q output of flip-flop 41 is connected to the inputs of inverters 46 and 47. The output of inverter 46 is tied to the D input of flip-flop 41. The Q output of flip-flop 41 is a pulse signal at one-half the frequency of the signal $f_{vco}$.

The output of inverter 47 is tied to one input of an exclusive OR gate 52. The Q output of the flip-flop 42 is connected to the other input of the exclusive OR gate 52. The output of exclusive OR gate 52 is tied to the D input of flip-flop 42. The output signal from flip-flop 42 is the feedback signal $f_{fb}$ and has a frequency one-fourth that of the signal $f_{vco}$. The rising transitions of the feedback signal $f_{fb}$ are delayed relative to rising transitions of the signal $f_{vco}$ by one flip-flop clock-to-output propagation delay but this delay is not shown in FIG. 4 because it is not germane to the invention. The Q output of flip-flop 41 is connected to the clock input of a decoder 36, which receives the AES/EBU signal at its input, and to one input of an AND gate 54. The decoder 36, which may comprise a shift register and combinational logic elements, clocks the input datastream at twice the frequency of the AES/EBU clock. The decoder detects three consecutive samples of the same value followed by one of the opposite value, i.e. the sequence 1110 or the sequence 0001, and provides an output signal $f_{pre}$ that is high during the preamble of the AES/EBU signal and is otherwise low. The signal $f_{pre}$ is inverted to provide a preamble mask signal $f_{msk}$ (FIG. 5, waveform E).

The Q output of flip-flop 42 is connected via an inverter 48 to the second input of the AND gate 54. The output of AND gate 54 is connected to the D input of flip-flop 43. The signal $f_{vco}$ is also applied to the clock input of the flip-flop 43 via an inverter 49 and therefore flip-flop 43 operates on falling transitions of the signal $f_{vco}$. The output signal from flip-flop 43 is a control signal $f_{rst}$ at the same frequency as the feedback signal $f_{fb}$ and having a 25% duty cycle. The rising transition of the control signal $f_{rst}$ occurs about three-eighths period before the next rising transition of the feedback signal. Propagation delays in flip-flop 43 are not shown in FIG. 4. The frequency divider 10' thereby not only divides the frequency of the signal $f_{vco}$ by four to produce the signal $f_{fb}$ but also divides the period of the signal $f_{fb}$ into two intervals, depending on the state of the signal $f_{rst}$.

The phase comparator 6' is the same as that shown in FIG. 2 except that it includes an OR gate 32 that is connected between the output of the AND gate 30 and the reset input of flip-flop 24 and receives the control signal $f_{rst}$ at its second input, and the D inputs of flop-flops 20, 24 are not connected to a logical one level but to the inverted output of the decoder 36.

When the signal $f_{fb}$ is not locked to the signal $f_{in}$, the code violation is generally not detected and accordingly $f_{pre}$ remains low and the D inputs of flip-flops 20, 24 remain high. The preamble occupies four time slots in each subframe of the AES/EBU signal. Since the signal $f_{fb}$ has one clocking transition for each time slot (assuming its frequency is close to the clock frequency of the AES/EBU signal), the signal $f_{fb}$ has four clocking transitions during the preamble. The code violation results in the signal $f_{in}$ having only three clocking transitions during the preamble. Therefore, during the preamble the flip-flop 24 will be set more often than the flip-flop 20. The signal $f_{rst}$ ensures that flip-flop 24 is reset once per cycle of the signal $f_{fb}$, regardless of the state of the signal $f_{in}$, and thereby prevents the flip-flop 24 from adding excessive charge to the loop filter during the preamble, thereby delaying acquisition of lock.

When lock has been acquired, the decoder 36 is able to detect the code violation. Accordingly, the signal $f_{msk}$, which is applied to the D inputs of the flip-flops 20, 24, is held low during the preamble, and so neither flip-flop is placed in the set condition and no charge is sent into or out of the error amplifier 12. In this manner the phase comparator 6' is disabled during the preamble of the AES/EBU input signal and so the code violation is prevented from disturbing the synchronization of the VCO with respect to the input datastream as shown in FIG. 5 by the waveform F.

When lock has been acquired and the preamble mask signal $f_{msk}$ is high, the D inputs of flip-flops 20 and 24 are loaded waiting for clocking transitions from the input signal $f_{in}$ and the feedback signal $f_{fb}$. When flip-flop 20 receives a clocking transition from the input signal $f_{in}$, its output Q20 is set high; likewise the output Q24 of flip-flop 24 is set high upon receiving a clocking transition from the feedback signal $f_{fb}$. Once the outputs of flip-flops 20 and 24 are clocked high, the AND gate 30 receives two ones at its inputs and produces a one at its output. Therefore, flip-flops 20 and 24 are both reset shortly after both clocking transitions have been received, as in the case of FIG. 1. However, due to the propagation delay in OR gate 32, Q24 will remain high slightly longer than Q20, and more charge will be pumped into than pulled from the error amplifier 12. This would tend to disturb lock, but may be compensated by selecting a slightly greater resistance value for resistor 40 than for resistor 38.

If the decoder 36 fails to detect a code violation when lock has been achieved, so that the flip-flops 20, 24 remain enabled during the preamble, the signal $f_{rst}$ will function to reset flip-flop 24 and prevent excess charge being pumped into the error amplifier due to the greater number of clocking transitions in signal $f_{fb}$ than in signal $f_{in}$.

It will therefore be seen that both the signal $f_{rst}$ and the signal $f_{msk}$ act to limit the energy that can be introduced into the error amplifier due to the code violation. In this manner, the phase lock loop is effectively immunized from the violation, and accordingly the VCO 8 can be implemented using an LC oscillator without the feedback signal being subject to substantial jitter that would interfere with data recovery. Accordingly, the illustrated phase lock loop is able to lock to signals having a wide frequency range.

It will be appreciated that the capture range of the phase lock loop shown in FIG. 3 is from the signal $f_{fb}$ lagging the signal $f_{in}$ by up to $2\pi$ to the signal $f_{fb}$ leading the signal $f_{in}$ by up to $1.25\pi$, but this is still better than can be achieved using a duty-cycle sensitive phase comparator.

It will be appreciated that the invention is not restricted to the particular embodiments that have been described, and that variations may be made therein without departing from the scope of the invention as defined in the appended claims and equivalents thereof.

We claim:

1. A method of comparing phase of first and second signals, wherein the first signal is composed of periodic frames each comprising a preamble and a data interval, said method comprising:

(a) producing an output signal according to the phase relationship between the first and second signals; and (b) disabling step (a) during the preamble of the first signal.

2. A method according to claim 1, comprising generating the second signal with frequency dependent on said output signal.

3. A method according to claim 1, comprising creating a binary control signal in response to the second signal, the frequency of the binary control signal being equal to that of the second signal, and modifying the output signal according to the state of the binary control signal.

4. A method according to claim 1, wherein the output signal has at least two signal components and the method comprises creating a binary control signal in response to the second signal, the frequency of the binary control signal being equal to that of the second signal, and clearing at least one of said signal components according to the state of the binary control signal.

5. A method of phase comparison comprising the steps of:

receiving a first periodic signal of a first frequency, a second periodic signal of a second frequency closely matching the first frequency, and a mask signal having an enable state and a disable state;

processing the second signal to produce a control signal having a reset state and a non-reset state and a frequency equal to said second frequency;

if the mask signal is in the enable state, producing a first output set signal upon receiving a clocking event of the first signal and a second output set signal upon receiving a clocking event of the second signal;

clearing the first and second output set signals in response to coincidence of said first and second output set signals; and clearing at least one of said first and second output set signals when the control signal is in the reset state.

6. A phase comparison apparatus for comparing phase of a first periodic signal of a first frequency and a second periodic signal of a second frequency that closely matches the first frequency, said phase comparison apparatus comprising:

a processing means for generating a periodic control signal in response to the second signal, wherein the frequency of the periodic control signal is equal to that of the second signal and the periodic control signal has a reset state and a non-reset state; and a phase comparator means connected to receive the first and second signals, a mask signal having an enable state and a disable state, and the control signal, and the phase comparator means being operative to produce an output signal according to the phase relationship between the first and second signals when the control signal is in its non-reset state and the mask signal is in the enable state and to modify the output signal to a predetermined state when the control signal enters its reset state.

7. A phase comparison apparatus according to claim 6, wherein the phase comparator means also receives a mask signal having an enable state and a disable state, and wherein the phase comparator means is operative to produce said output signal only when the mask signal is in the enable state.

8. A phase comparison apparatus according to claim 6, wherein the phase comparator means receives a first clocking event from one of said first and second signals and a subsequent second clocking event from the other of said first and second signals and said output signal is representative of the time interval between the first clocking event and the second clocking event.

9. A phase comparison apparatus according to claim 6, wherein said phase comparator means produces a first output signal having an active state of a time duration representative of a positive phase difference between the first and second signals, and produces an opposite polarity, second output signal having an active state of a time duration representative of a negative phase difference between the first and second signals.

10. A phase comparison apparatus comprising:

a phase comparator means for receiving a first periodic signal having a first frequency, a second periodic signal having a second frequency closely matching the first frequency, a control signal having a reset state and a non-reset state and a frequency equal to the second frequency, a clear signal having a logical true state and a logical false state, and a mask signal having an enable state and a disable state, and said phase comparator means being operative, if the mask signal is in the enable state, to produce a first output set signal upon receiving a first clocking event from one of said first and second signals, to produce a second output set signal of opposite polarity with respect to the first output set signal upon receiving a second clocking event from the other of said first and second signals, to clear the first and second output set signals in response to the clear signal being in the logical true state, and to clear at least one of said first and second output signals when the control signal is in the reset state;

a coincidence means for receiving the first and second output set signal, and generating the clear signal in the logical true state in response to coincidence of the first and second output set signals and otherwise generating the clear signal in the logical false state; and a processing means for generating said second periodic signal and said control signal in response to said first and second output set signals.

11. A method of processing a data signal composed of periodic frames each comprising a preamble and a data interval, said method comprising:

(a) generating an extracted clock signal in response to the data signal, the frequency content of the clock signal being different during the preamble than during the data interval;

(b) producing an output signal in the event of a predetermined phase relationship between the extracted clock signal and a second signal;

(c) modifying the output signal at a predetermined phase during the cycle of the second signal regardless of the state of the extracted clock signal; and (d) disabling step (b) during the preamble.

12. A method according to claim 11, comprising generating the second signal in response to the output signal, whereby the frequency of the second signal closely matches that of the extracted clock signal, generating a decoding signal in response to the output signal, and employing the decoding signal to decode the data signal and generate a preamble signal, and wherein step (d) comprises employing the preamble signal to disable step (b).

13. A method according to claim 11, wherein the output signal has at least two signal components and step (c) comprises clearing at least one of said signal components.

14. A method according to claim 13, wherein step (b) comprises generating a first output signal component if the extracted clock signal leads the second signal and generating a second output signal component if the extracted clock signal lags the second signal, and step (c) comprises generating a reset signal in a clear state at said predetermined phase during the cycle of the second signal and clearing at least one of the first and second output signal components in response to the reset signal being in said clear state.

15. A method according to claim 14, comprising generating the second signal in response to the first and second output signal components, whereby the frequency of the second signal closely matches that of the extracted clock signal, generating a decoding signal in response to the first and second output signal components, and employing the decoding signal to decode the data signal and generate a preamble signal, and wherein step (d) comprises employing the preamble signal to disable step (b).

16. A method according to claim 11, wherein step (b) comprises generating a first output signal component if the extracted clock signal leads the second signal and generating a second output signal component if the extracted clock signal lags the second signal, and step (c) comprises clearing at least one of the first and second output signal components.

17. A method according to claim 16, comprising generating the second signal in response to the first and second output signal components, whereby the frequency of the second signal closely matches that of the extracted clock signal, generating a decoding signal in response to the first and second output signal components, and employing the decoding signal to decode the data signal and generate a preamble signal, and wherein step (d) comprises employing the preamble signal to disable step (b).

18. A logic circuit comprising:

a first D flip-flop having a D input, a clock input, a reset input, and an output, a second D flip-flop having a D input, a clock input, a reset input, and an output, an AND means having two inputs connected to the two outputs respectively of the first and second flip-flops and also having an output, the AND means asserting a logic 1 output in the event that the first and second flip-flops are both in a set state and otherwise asserting a logic 0 output, and an OR means having a first input connected to the output of the AND means, an output connected to the reset input of the first flip-flop, and also having a second input, whereby the first flip-flop is reset in the event that the two flip-flops are both in the set state or in the event that the OR means receives a logic 1 at its second input regardless of the whether the two flip-flops are both in the set state.

19. A logic circuit according to claim 18, wherein the first and second flip-flops each have a Q output and the inputs of the AND means are connected to the Q outputs respectively and the output of the AND means is connected to the reset input of the second flip-flop, whereby the first and second flip-flops are reset in the event that the two flip-flops each have a logic 1 at the Q output and the first flip-flop is reset in the event that the OR means receives a logic 1 at its second input regardless of the Q outputs of the two flip-flops.

* * * * *